United States Patent
Ellis-Monaghan et al.

(10) Patent No.: US 8,233,070 B2
(45) Date of Patent: Jul. 31, 2012

(54) VARIABLE DYNAMIC RANGE PIXEL SENSOR CELL, DESIGN STRUCTURE AND METHOD

(75) Inventors: John J. Ellis-Monaghan, Grand Isle, VT (US); Mark D. Jaffe, Shelburne, VT (US); Charles F. Musante, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 12/553,457

(22) Filed: Sep. 3, 2009

(65) Prior Publication Data
US 2010/0245644 A1 Sep. 30, 2010

Related U.S. Application Data

(60) Provisional application No. 61/163,888, filed on Mar. 27, 2009.

(51) Int. Cl.
*H04N 3/14* (2006.01)
(52) U.S. Cl. ........................ 348/308; 348/296
(58) Field of Classification Search .................. 348/294, 348/296, 302, 308
See application file for complete search history.

(56) References Cited

U.S. PATENT DOCUMENTS

| | | | |
|---|---|---|---|
| 7,091,531 B2 | 8/2006 | Boemler | |
| 7,952,629 B2 * | 5/2011 | Cieslinski | 348/294 |
| 2004/0036784 A1 | 2/2004 | Bock | |
| 2005/0012168 A1 | 1/2005 | Hong | |
| 2005/0052554 A1 * | 3/2005 | Sakurai et al. | 348/301 |
| 2005/0224843 A1 | 10/2005 | Boemler | |
| 2006/0232577 A1 | 10/2006 | Edwards et al. | |
| 2006/0243887 A1 | 11/2006 | Boemler | |

OTHER PUBLICATIONS

E-mail from IBM China which indicates that the date of the issued Office Action is May 25, 2011.

* cited by examiner

*Primary Examiner* — Timothy J Henn
(74) *Attorney, Agent, or Firm* — Scully, Scott, Murphy & Presser, P.C.; Anthony J. Canale

(57) ABSTRACT

A pixel sensor cell including a column circuit, a design structure for fabricating the pixel sensor cell including the column circuit and a method for operating the pixel sensor cell including the column circuit are predicated upon the measurement of multiple reference data point and signal data point pairs from a floating diffusion at a variable capacitance. The variable capacitance is provided by excluding or including a transfer gate transistor capacitance in addition to a floating diffusion capacitance. Such a variable capacitance provides variable dynamic ranges for the pixel sensor cell including the column circuit.

18 Claims, 5 Drawing Sheets

VARIABLE DYNAMIC RANGE PIXEL SENSOR CELL, DESIGN STRUCTURE AND METHOD

BACKGROUND

1. Field of the Invention

The invention relates generally to pixel sensor cells, design structures for fabrication thereof and methods for operation thereof. More particularly, the invention relates to pixel sensor cells with enhanced dynamic range capabilities.

2. Description of the Related Art

Solid state sensors are popular optoelectronic components that find use in various technology applications, including in particular imaging technology applications. Particularly common are solid state sensors that are used as active light capture and imaging elements within digital cameras.

Solid state image sensors may be fabricated using any of several semiconductor technologies for the active light capture and imaging elements. Charge coupled devices (CCDs) are known as more traditional solid state image sensor light capture and imaging elements. Complementary metal oxide semiconductor (CMOS) devices provide yet another semiconductor based active light capture and imaging element for use within a solid state image sensor. Solid state image sensors predicated upon CMOS semiconductor devices are generally desirable insofar as such CMOS based solid state image sensors may consume less power in comparison with other types of solid state image sensors. Moreover, CMOS based solid state image sensors allow for fabrication of CMOS based electrical support circuit components simultaneously with CMOS based solid state image sensor components.

While solid state image sensors in general, and CMOS image sensors more particularly, are desirable within the optoelectronic component fabrication art, solid state image sensors in general; and CMOS image sensors more particularly, are not entirely without problems. In particular, performance enhancements, such as dynamic range performance enhancements, are often desirable within solid state sensors in general and solid state image sensors more particularly, in order to provide for accurate and high contrast images.

Various solid state sensor structures and designs, and methods for fabrication thereof, are known in the optoelectronic art.

For example, Bock, in U.S. Pub. No. 2004/0436784, teaches a CMOS pixel sensor cell that includes, among other features, a wide dynamic range. This particular CMOS pixel sensor cell provides the wide dynamic range through use of a three phase operating methodology.

In addition, Boemler, in U.S. Pub. No. 2005/0224843, U.S. Pat. No. 7,091,531 and U.S. Pub. No. 2006/0243887, teaches another CMOS pixel sensor cell with a wide dynamic range. This particular CMOS pixel sensor cell provides the wide dynamic range through use of a floating diffusion that has a variable capacitance.

Solid state sensors, including charge coupled device (CCD) image sensors and further including in particular complementary metal oxide semiconductor (CMOS) image sensors, are likely to be of continued interest and continued importance as solid state sensor technology advances. Thus, desirable are solid state sensors, design structures for fabrication thereof and methods for operation thereof, as well as related component sub-structures, that provide for improved performance, including enhanced dynamic range capabilities.

SUMMARY

The invention includes a pixel sensor cell including a column circuit, a design structure for fabricating the pixel sensor cell that includes the column circuit and a method for operating the pixel sensor cell that includes the column circuit. Each of the forgoing pixel sensor cell, design structure and method is predicated upon the use of a plurality of sets of data points (i.e., pairs of reference data points and signal data points) for charge stored upon a floating diffusion within a pixel sensor cell at various capacitance loading stages in operation of the pixel sensor cell, that allow for the plurality of sets of data points when read from the floating diffusion to the column circuit to provide a variable and wider dynamic range of the pixel sensor cell.

A particular pixel sensor cell including a column circuit in accordance with the invention includes a photodiode coupled in series with a first source/drain region of a transfer gate transistor. The pixel sensor cell also includes a floating diffusion coupled in series with a second source/drain region of the transfer gate transistor. The pixel sensor cell also includes a column circuit output coupled to the floating diffusion through a gate of a source follower transistor connected to the floating diffusion, the source follower transistor coupled in series with a row select transistor whose source/drain region provides the column circuit output. The pixel sensor cell also includes a column circuit connected to the column circuit output. The column circuit includes at least two pass gate transistors having a first source/drain region connected in parallel to the column circuit output, each pass gate transistor further having a second source/drain region connected in series to a separate data storage capacitor.

A particular design structure for fabricating a pixel sensor cell that includes the column circuit includes, embodied within a machine readable medium, a photodiode coupled in series with a first source/drain region of a transfer gate transistor. The design structure also includes a floating diffusion coupled in series with a second source/drain region of the transfer gate transistor. The design structure also includes a column circuit output coupled to the floating diffusion through a gate of a source follower transistor connected to the floating diffusion, the source follower transistor coupled in series with a and row select transistor whose source/drain region provides the column circuit output. The design structure also includes a column circuit connected to the column circuit output. The column circuit includes at least two pass gate transistors having a first source/drain region connected in parallel to the column circuit output, each pass gate transistor further having a second source/drain region connected in series to a separate data storage capacitor.

A particular method for operating the pixel sensor cell that includes the column circuit includes providing the pixel sensor cell that includes: (1) a photodiode coupled in series with a first source/drain region of a transfer gate transistor; (2) a floating diffusion coupled in series with a second source/drain region of the transfer gate transistor; (3) a column circuit output coupled to the floating diffusion through a gate of a source follower transistor connected to the floating diffusion, the source follower transistor coupled in series with a and row select transistor whose source/drain region provides the column circuit output; and (4) a column circuit connected to the column circuit output, the column circuit including at least two pass gate transistors having a first source/drain region connected in parallel to the column circuit output, each pass gate transistor further having a second source/drain region connected in series to a separate data storage capacitor. This particular method also includes reading to the separate data storage capacitors at least: (1) a first reference charge and a first signal charge from the floating diffusion with the transfer gate transistor off; and (2) a second reference charge and a second signal charge different from the first signal charge from the floating diffusion with the transfer gate transistor on.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a pixel sensor cell including a column circuit, a design structure for fabricating the pixel sensor cell including the column circuit and a method for operating the pixel sensor cell including the column circuit, is understood within the context of the description set forth below. The description set forth below is understood within the context of the drawings described above.

Figure 1:
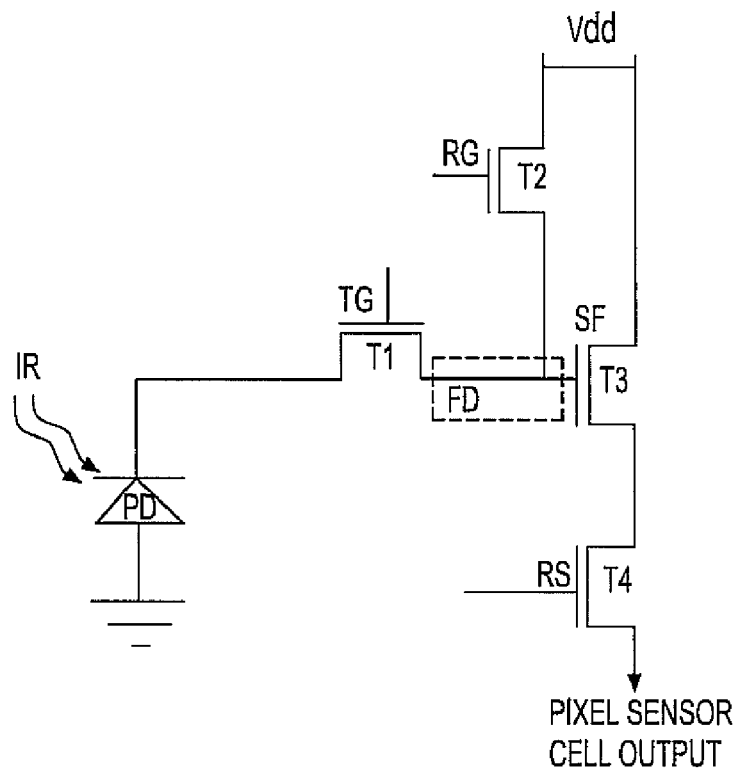
FIG. 1 shows a schematic circuit layout diagram of a pixel sensor cell in accordance with an embodiment of the invention, the particular pixel sensor cell as illustrated in FIG. 1 being generally conventional in the art.

FIG. 1 shows a schematic circuit layout diagram of a pixel sensor cell in accordance with the invention, the particular pixel sensor cell as illustrated in FIG. 1 being generally conventional in the art.

FIG. 1 shows a photodiode PD upon which is incident incoming radiation IR that provides for charge generation within the photodiode PD. The electrical output of the photodiode PD is connected to a first source/drain region of a transfer gate TG transistor T1. The other source/drain region of the transfer gate TG transistor T1 is connected to a floating diffusion FD. Also connected to the floating diffusion FD is as source/drain region of a reset gate RG transistor T2 and a gate of a source follower SF transistor T3. The other source/drain region of the reset gate RG transistor T2 and a first source/drain of the source follower SF transistor T2 are connected to a supply voltage Vdd. A second source/drain region of the source follower SF transistor T3 is connected to a first source/drain region of a row select RS transistor T4. The remaining source/drain region of the row select RS transistor T4 provides an output signal for the pixel sensor cell whose schematic circuit layout diagram is illustrated in FIG. 1.

Figure 2:
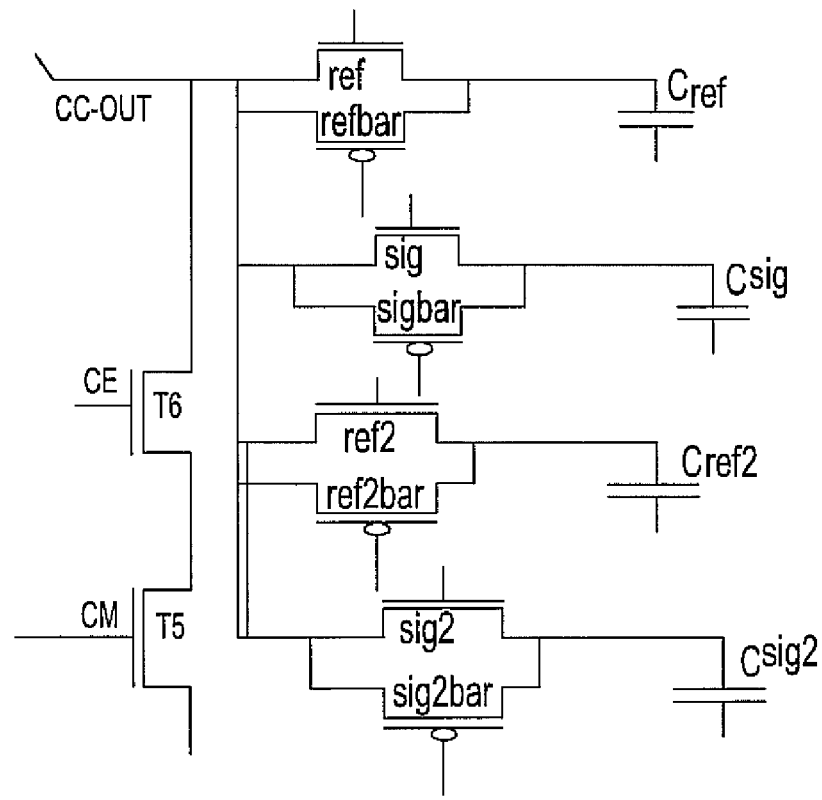
FIG. 2 shows a schematic circuit layout diagram of a column circuit in accordance with the embodiment of the invention that is used in conjunction with the pixel sensor cell whose schematic circuit layout diagram is illustrated in FIG. 1.

FIG. 2 shows a column circuit in accordance with a particular embodiment of the invention that is connected to the pixel sensor cell whose schematic circuit layout diagram is illustrated in FIG. 1. As is illustrated in FIG. 1 and FIG. 2, the pixel sensor cell of FIG. 1 and the column circuit of FIG. 2 are connected via node CC-OUT (i.e., the CC-OUT node in FIG. 2 is connected to the pixel sensor cell output in FIG. 1).

Within FIG. 2, the column circuit output CC-OUT is connected to a source/drain region of a column enable CE transistor T6 that is connected in series with a first source/drain region of a current mirror CM transistor T5. The second source/drain region of the current mirror CM transistor T5 is connected to ground. Also connected to the column circuit output CC-OUT is a bus to which is connected parallel mated pairs of complementary transistors ref/refbar, sig/sigbar, ref2/ref2bar and sig2/sig2bar that are intended as complementary pass gates. To a distal end of each of the foregoing parallel mated pairs of complimentary transistors is connected a particularly designated capacitor Cref, Csig, Cref2 or Csig2.

The particular photodiode PD, transistor T1-T6, parallel mated pairs of complementary transistors ref/refbar, sig/sigbar, ref2/ref2bar and sig2/sig2bar, and capacitors Cref, Csig, Cref2 and Csig2 that are illustrated within the schematic circuit layout diagrams of FIG. 1 and FIG. 2 are otherwise generally conventional in the semiconductor fabrication art. Typically, the photodiode PD comprises an n photodiode having a dopant concentration from about 5e15 to about 5E17 n dopant atoms per cubic centimeter within a p semiconductor substrate. that has a p dopant concentration from about 1e13 to about 1e17 p dopant atoms per cubic centimeter. Alternative dopant polarities and concentrations may also be used within the context of the embodiment and the invention.

Figure 3:
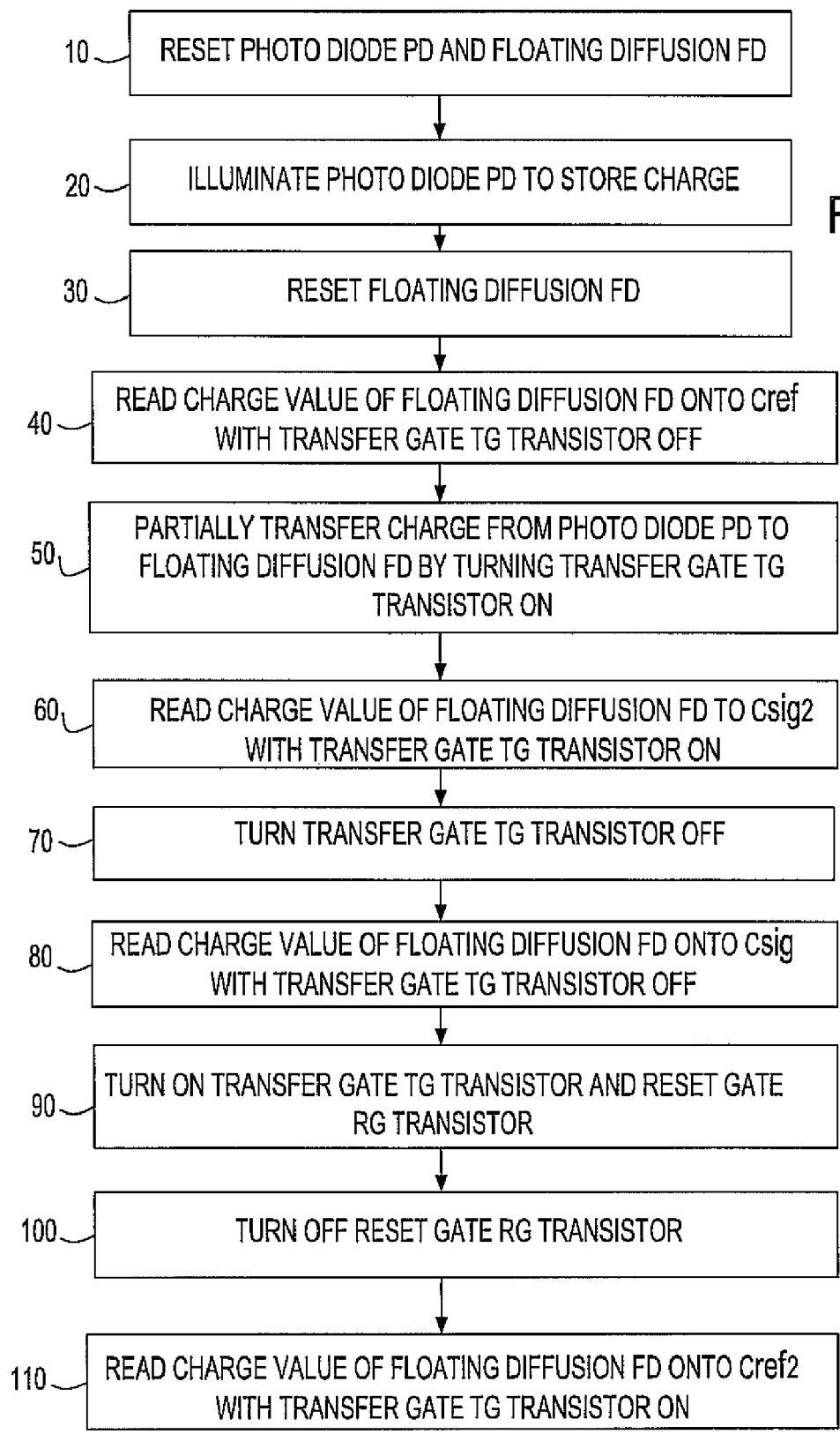
FIG. 3 shows a process flow diagram illustrating process steps in accordance with a particular method for operating a pixel sensor cell including a column circuit in accordance with the embodiment of the invention.

As is understood by a person skilled in the art, further discussion of the operation of the composite electric circuit that comprises and includes the pixel sensor cell having the circuit layout diagrams of FIG. 1, and the column circuit whose circuit layout diagram is illustrated in FIG. 2 is understood within the context of the schematic process flow diagram of FIG. 3.

As a first process step 10 within the schematic process flow diagram of FIG. 3 (i.e., which provides for variable and enhanced dynamic range capabilities within the composite electrical circuit whose schematic circuit layout diagrams are illustrated in FIG. 1 and FIG. 2) both the photodiode PD and the floating diffusion FD are reset. Such a reset of the photodiode PD and the floating diffusion FD is intended to fully deplete the photodiode PD, eliminating stored charge on the photodiode PD and bring the floating diffusion FD to a known potential by actuating the reset gate RG transistor T2 and the transfer gate TG transistor T1. When the resetting of the photodiode PD and the floating diffusion FD is complete, both the transfer gate TG transistor T1 and the reset gate RG transistor T2 are turned off.

As the next process step 20 within the schematic process flow diagram of FIG. 3, the photodiode PD is illuminated with light to thus generate and store charge on the photodiode PD. For a pixel sensor cell generally in accordance with the art as is illustrated within the schematic circuit layout diagram of FIG. 1, an amount of charge generated and stored upon the photodiode PD incident to illumination of the photodiode PD will typically range from about 5 to about 30000 electrons.

As the next process step 30 within the schematic process flow diagram of FIG. 3, the floating diffusion FD only, and not the photodiode PD, is reset. Such a reset of the floating diffusion FD only, and not the photodiode PD, is effected using the methodology as outlined above within the context of process step 10 for resetting the photodiode PD and the floating diffusion FD, but with the actuation and use of the reset gate RG transistor T2 only, and not the actuation and use of the transfer gate TG transistor T1.

As the next process step 40 within the schematic process flow diagram of FIG. 3, the potential voltage value on the floating diffusion FD, after being reset, and with the transfer gate TG transistor T1 off, is read onto the capacitor Cref as a first reference voltage.

As the next process step 50 within the schematic process flow diagram of FIG. 3, charge from the photodiode PD is partially transferred to the floating diffusion FD. Such a partial transfer of charge from the photodiode PD to the floating diffusion FD may be effected by use of different operating voltages for the transfer gate TG transistor T1 (i.e., TGHi). Such different operating voltages may within the context of this particular embodiment be used for designating different dynamic range options of the pixel sensor cell of FIG. 1.

As the next process step 60 within the schematic process flow diagram of FIG. 3, the charge newly transferred to the floating diffusion FD from the photodiode PD results in a change of voltage on the floating diffusion. This floating diffusion voltage is read onto the capacitor Csig2 as a second signal, while the transfer gate TG transistor T1 is on.

As the next process step 70 within the schematic process flow diagram of FIG. 3, the transfer gate TG transistor T1 is turned off.

As the next process step 80 within the schematic process flow diagram of FIG. 3, the voltage value of the floating diffusion FD is read onto the capacitor Csig as a first signal, with the transfer gate TG transistor T1 off.

As the next process step 90 within the schematic process flow diagram of FIG. 3, the transfer gate TG transistor T1 and the reset gate RG transistor T2 are turned on to once again reset the photodiode PD and reset the floating diffusion FD.

As the next process step 100 within the schematic process flow diagram of FIG. 3, the reset gate RG transistor T2 is turned off.

As the final process step 110 within the schematic process flow diagram of FIG. 3, the voltage value on the floating diffusion FD is read onto the capacitor Cref2 as a second reference capacitance with the transfer gate TG transistor T1 turned on.

As a result of the foregoing process steps within the schematic process flow diagram of FIG. 3, one obtains a first reference voltage on the capacitor Cref and a first signal voltage on the capacitor Csig, both of which are read from the floating diffusion FD to the particular capacitor Cref or Csig with the transfer gate TG transistor T1 off. Also resulting from the foregoing process steps within the schematic process flow diagram of FIG. 3 is a second reference voltage on the capacitor Cref2 and a second signal voltage on the capacitor Csig2 which are read from the floating diffusion FD to the particular capacitor Cref2 or Csig2 with the transfer gate TG transistor T1 on.

As is understood by a person skilled in the art, a "reading" of the voltage from the floating diffusion FD to a particular capacitor Cref, Csig, Cref2 or Csig2 within the context of the process flow diagram of FIG. 3 is undertaken by turning on the row select RS transistor T4 (in FIG. 1), turning on the CE column enable transistor T6 (in FIG. 2) and turning on the appropriate complementary pass gate transistors (REF, and REFBAR for reading a potential onto Cref; SIG and SIGBAR for reading a potential onto Csig, etc.). Transistor T5 is biased appropriately from a current mirror circuit which would be attached to node CM as is commonly known in the art. (typically biased to allow from about 1 uA to about 100 uA of current through transistor T5).

From the foregoing process sequence within the schematic process flow diagram of FIG. 3, differential voltage values for V(Csig)−V(Cref) and V(Csig2)−V(Cref2) may be readily measured and determined. The V(Csig)−V(Cref) differential voltage value is thus the result of a normal low noise correlated double sampling method that provides a high gain, low noise, and narrow dynamic range. This particular data set requires a low capacitance floating diffusion FD to obtain an optimally high gain for a low level of charge on the photodiode. The V(Csig2)−V(Cref2).data set corresponds with an uncorrelated double sampling mode that effectively increases the floating diffusion FD capacitance by the value of the transfer gate TG transistor T1 capacitance to provide a comparatively low gain wide dynamic range. This particular second data set may also provide a level shift of the floating diffusion voltage by virtue of a possible particular bias (i.e., TGHi) of the transfer gate TG transistor T1.

A practical example is helpful for providing a perspective for the foregoing embodiment, and for the invention. For such a practical example, one can assume a signal of 20 electrons on the photodiode PD. One can also assume a floating diffusion FD capacitance of 1 femto-farad. Upon transferring the photodiode's PD charge of 20 electrons onto the floating diffusion one may observe a change in the voltage on the floating diffusion FD of 20 electrons×1.6e−19 coulombs per electron/1e−15 farads=3 mV, which is resolvable by conventional source follower circuitry and measured as the difference between the potentials on capacitors Csig and Cref. It is further assumed that a standard amplifier circuit may have about one volt dynamic range, which within the context of the foregoing mathematical analysis that includes a floating diffusion FD capacitance of 1 femto-farad, provides for an ability to resolve about 6250 electrons charge using Csig and Cref.

Figure 4:
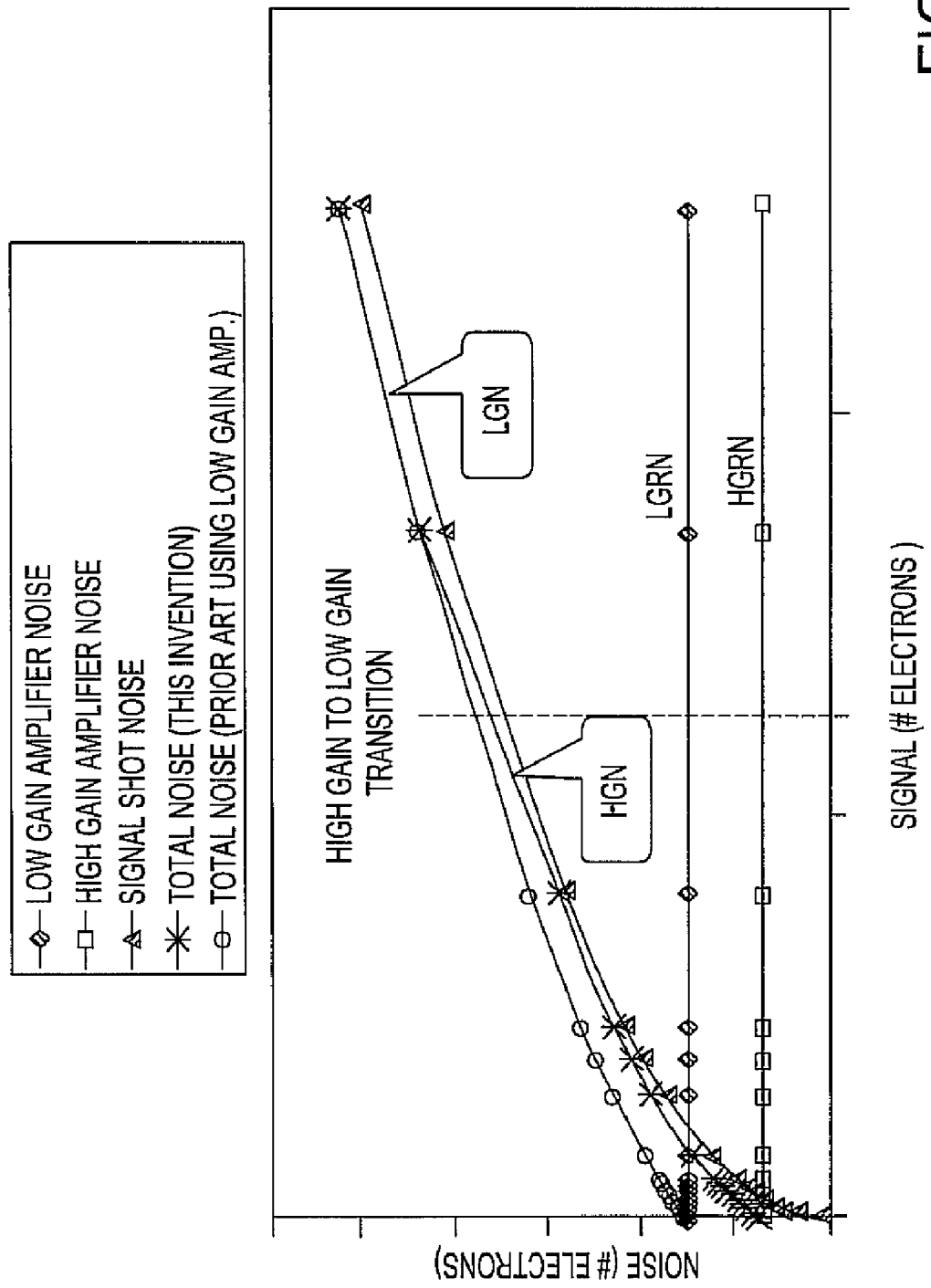
FIG. 4 shows a graph of Noise versus Signal illustrating high gain narrow dynamic range conditions and low gain wide dynamic range conditions for a pixel sensor cell including a column circuit in accordance with the embodiment of the invention.

As a further example, if one assumes a photodiode with 20,000 electrons of charge, one can also assume a floating diffusion FD capacitance of 1 femto-farad and a transfer gate TG transistor T1 capacitance (when a transfer gate TG transistor T1 is on) of 2.5 femto-farads. When considering only the floating diffusion FD capacitance of 1 femto-farad, the 20000 electrons charge would result in a voltage change on the floating diffusion of 20000×1.6e−19 coulombs per electron/1e−15 farads=3.2 V. This is beyond the range that a standard 3.3 volt technology amplifier can operate. However, when including the transfer gate TG transistor capacitance of 2.5 femto-farads to the floating diffusion FD capacitance of 1 femto-farad when reading the floating diffusion FD charge onto the capacitor Csig2, a 3.5 fold increase in a number of electrons charge that can be accurately measured may be realized. Thus, for this example, a voltage differential to be measured on Csig2 and Cref2 will be 20000×1.6e−19 coulombs per electron/3.5e−15 farads=0.91 V FIG. 4 shows a plot illustrating the noise characteristics (i.e., Noise versus Signal) for a pixel sensor cell including a column circuit in accordance with the foregoing example. FIG. 4 illustrates low gain noise LGN and high gain noise HGN, either of which is determined as a square root of a number of electrons combined with the readout chain noise. FIG. 4 also illustrates low gain reset noise LGRN (determined as the square root of the product if Boltzman's constant, temperature and aggregate capacitance of the floating diffusion FD and the transfer gate TG transistor (i.e., sqrt(kT(Cfd+

Ctg)) and a corresponding high gain reset noise HGRN absent the transfer gate TG transistor capacitance (i.e., sqrt(kT Cfd)).

Figure 5:
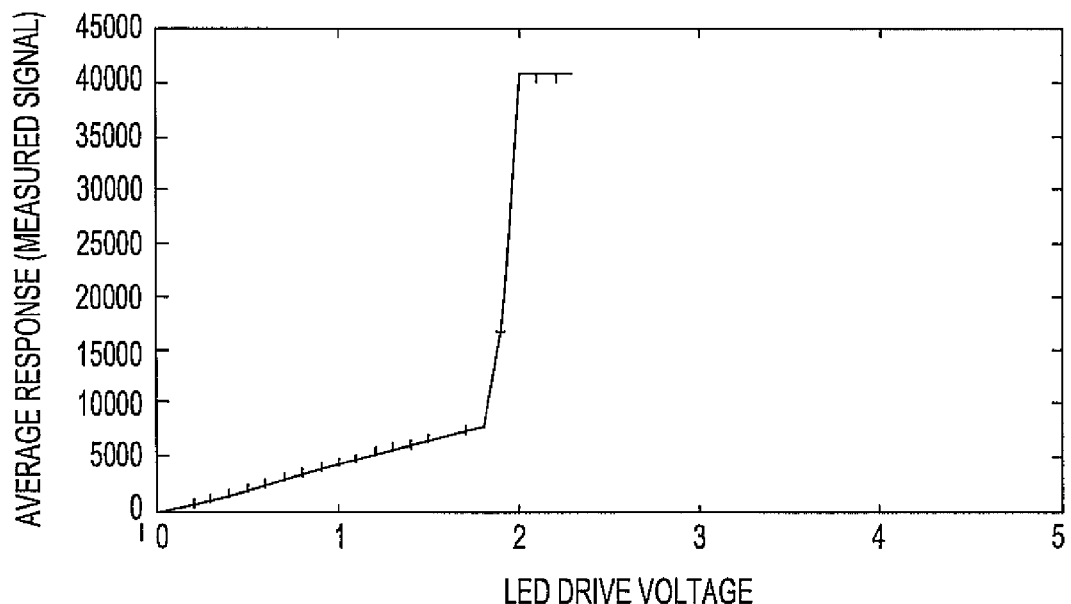
FIG. 5 shows a graph of Average Measured Signal versus LED Drive Voltage illustrating dynamic range conditions for a pixel sensor cell including a column circuit not in accordance with the invention.

FIG. 5 shows a graph of Average Response versus Light Emitting Diode (LED) Drive for a CMOS image sensor operating in the conventional (i.e., high gain) mode, not including a column circuit operated in accordance with the methodology of the invention. As is illustrated within the graph of FIG. 5, signal is able to accurately measure light response up to a LED voltage of about 1.8V, beyond which voltage the response becomes non-linear.

Figure 6:
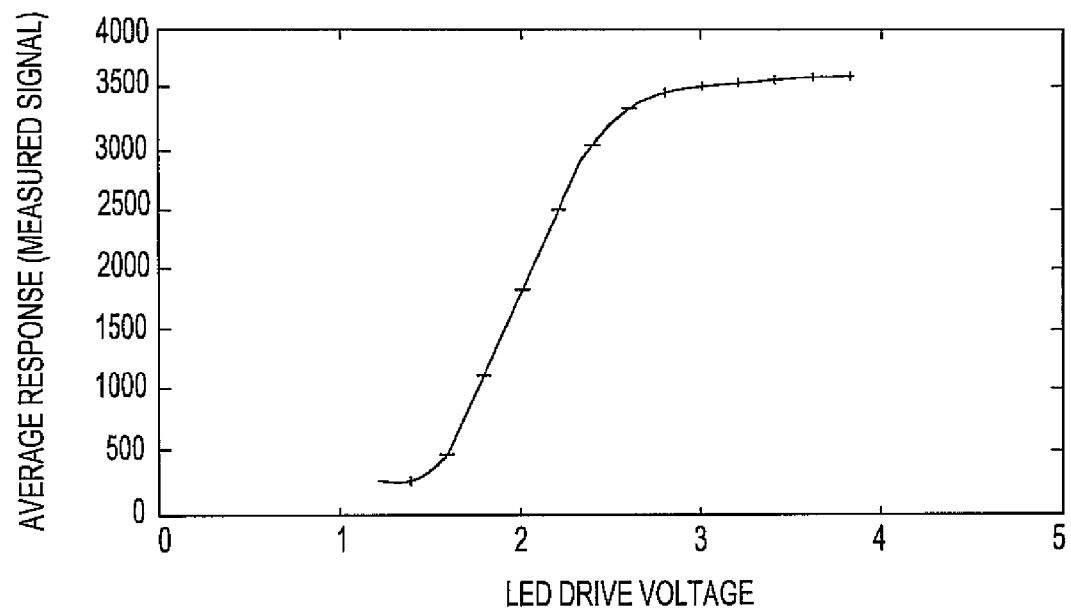
FIG. 6 shows a graph of Average Measured Signal versus LED Drive Voltage illustrating enhanced dynamic range conditions for a pixel sensor cell including a column circuit in accordance with the invention.

FIG. 6 shows a graph of Average Measured Response versus LED Drive Voltage for a CMOS image sensor including a column circuit operated in accordance with the methodology of the invention in its low gain mode. As is illustrated within the graph of FIG. 6, signal discrimination is acceptable between 1.5 and 3.8V, which when combined with the low gain mode, allows for measurements from 0 to 3.8V.

The foregoing embodiment more specifically, and the invention more generally, contemplates that there may be several extensions and enhancements to the embodiment and the invention. In particular, a floating diffusion FD capacitance may be further lowered to less than the exemplary 1 femto-farad, and as such a sensitivity of a CMOS image sensor at a narrow dynamic range region may be increased.

In addition, a transfer gate TG transistor T1 capacitance may also be increased, and to that end a higher aggregate floating diffusion FD and transfer gate TG transistor T1 capacitance ratio will yield a lowered sensitivity at a wide dynamic range for a CMOS image sensor.

Moreover, and as suggested above, the use of particular intermediate values for a transfer gate TG transistor actuation voltage (i.e., TGHi) may be contemplated for use as a level shifter that will provide for differences in where a floating diffusion charge or potential will reside in later stage amplifiers.

From a circuit layout diagram and circuit operational perspective, the embodiment and the invention also contemplate use of fewer than four capacitors Cref, Csig, Cref2 and Csig2, but at least two capacitors, or alternatively at least three capacitors, by providing for an initial readout of a reference signal, to an amplifier.

Also from a circuit layout diagram and circuit operational perspective, the embodiment and the invention contemplate the use of other than the pixel sensor cell whose schematic circuit layout diagram is illustrated in FIG. 1 (i.e., having four transistors not intended as including the transistors that are included within the column circuit whose schematic circuit layout diagram is illustrated in FIG. 2). Thus, the embodiment and the invention also contemplate applicability to pixel sensor cells having greater than 4 transistors, and up to at least 7 transistors, provided an appropriate inclusion within the pixel sensor cell of transfer gate TG transistor T1 and a floating diffusion FD.

From a circuit design perspective, the invention also contemplates the use of shared pixel architectures (i.e., where two pixels share the same floating diffusion to provide, and use, for example, one reset gate RG transistor, one source follower SF transistor, and one row select RS transistor, but two or four transfer gate TG transistors). The invention also contemplates switched rail architectures where a row select transistor is eliminated (i.e., an unshared version includes three transistors, a two shared version includes four transistors including two transfer gate transistors and a four shared version includes six transistors including four transfer gate transistors).

In addition, a column circuit architecture in accordance with the invention may be applied to many other common CMOS image sensor architectures. The column circuit in accordance with the invention may be used not only with an unshared 4T pixel sensor cell, but also with shared pixel sensor cell architectures. (2 shared transistors, 4 shared transistors) The column circuit in accordance with the invention may also be used with a row select transistor, or with the switched rail architecture (both shared and unshared.) The column circuit in accordance with the invention may in general be used with any pixel sensor cell architecture which relies upon charges in a photodiode/photogate being transferred to a floating diffusion for charge to voltage conversion.

Figure 7:
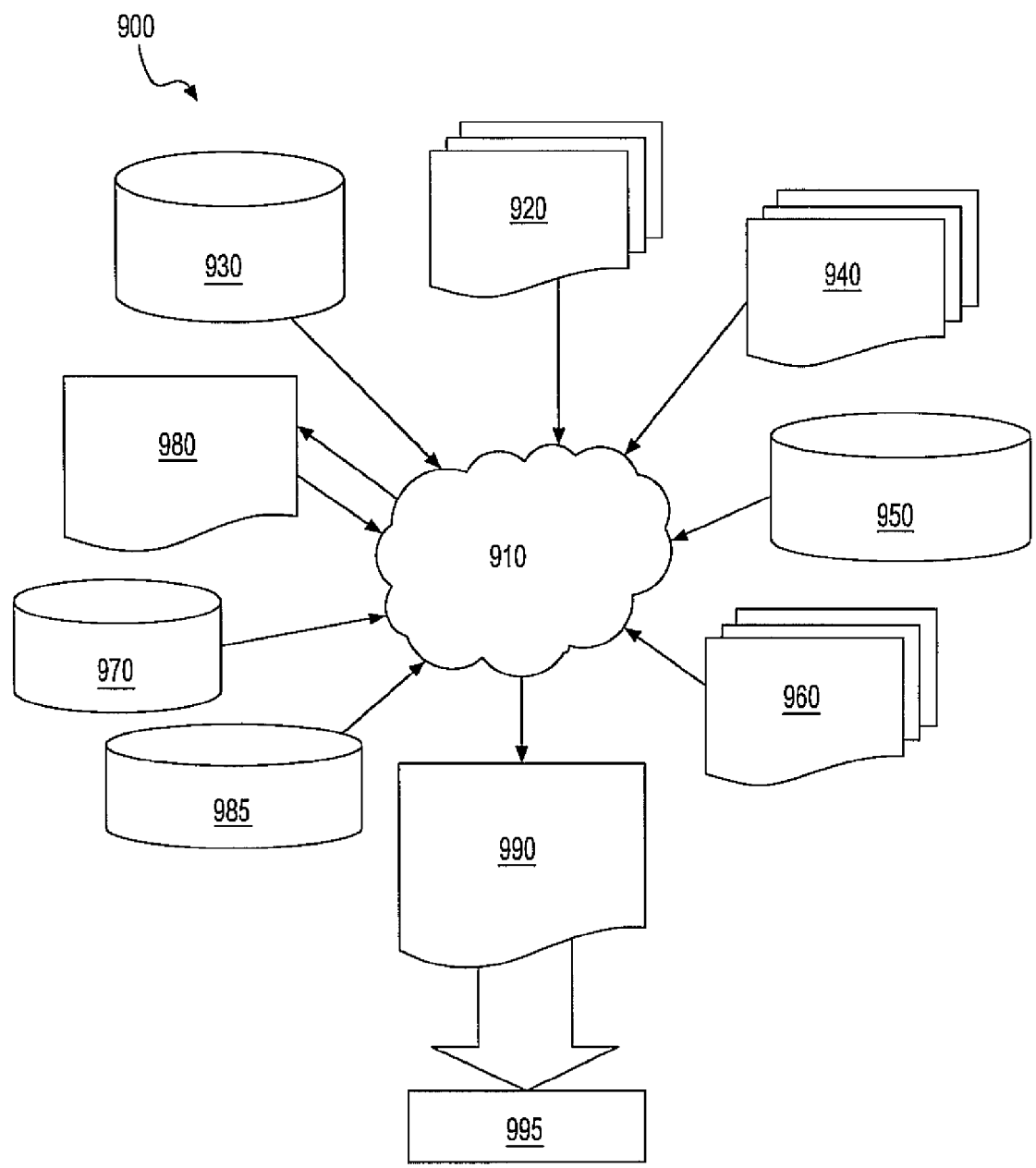
FIG. 7 shows a flow diagram of a design process used in semiconductor design, manufacture, and/or test.

FIG. 7 shows a block diagram of an exemplary design flow 900 used, for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 1 and FIG. 2 in the form of schematics or HDL, a hardware-description language (e.g., Verilog, VHDL, C, etc.).

Design structure 920 may be contained on one or more machine readable medium. For example, design structure 920 may be a text file or a graphical representation of an embodiment of the invention as shown in FIG. 1 and FIG. 2. Design process 910 preferably synthesizes (or translates) an embodiment of the invention as shown in FIG. 1 and FIG. 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 1 and FIG. 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1 and FIG. 2. Design structure 990 may then proceed to a stage 995 where, for example, design structure 990: proceeds to tape-out, is released to manufacturing, is released to a mask house, is sent to another design house, is sent back to the customer, etc.

The preferred embodiment is illustrative of the invention rather than limiting of the invention. Revisions or modifications may be made to methods, materials, structures or dimensions of a pixel sensor cell including a column circuit in accordance with the preferred embodiment while still providing a pixel sensor cell including a column circuit, design structure for fabrication thereof or method for operation thereof in accordance with the invention, further in accordance with the accompanying claims.

What is claimed is:

1. A pixel sensor cell circuit comprising:
    a photodiode coupled in series with a first source/drain region of a transfer gate transistor;
    a floating diffusion coupled in series with a second source/drain region of the transfer gate transistor;
    a column circuit output coupled to the floating diffusion through a gate of a source follower transistor connected to the floating diffusion, the source follower transistor coupled in series with a row select transistor whose source/drain region provides the column circuit output; and
    a column circuit connected to the column circuit output, the column circuit including a first set of two pass gate transistors and a second set of two pass gate transistors, each pass gate transistor of said first set and second set having a first source/drain region connected in parallel to the column circuit output, each of said two pass gate transistors of each respective said first and second set further having a second source/drain region connected in series to a separate data storage capacitor,
    wherein said first set of two pass gate transistors is configured for a correlated double sampling mode to obtain a respective first reference charge and a first signal charge from the floating diffusion with the transfer gate transistor off; and
    said second set of two pass gate transistors is configured for an uncorrelated double sampling mode to obtain a respective second reference charge and a second signal charge different from the first signal charge from the floating diffusion with the transfer gate transistor on.

2. The pixel sensor cell circuit of claim 1 wherein the pixel sensor cell circuit includes at least four transistors not included within the column circuit.

3. The pixel sensor cell circuit of claim 1 wherein the pixel sensor cell circuit includes at least six transistors not included within the column circuit.

4. The pixel sensor cell circuit of claim 1 wherein the pixel sensor cell circuit includes a shared pixel architecture.

5. A design structure encoded on a tangible machine readable data storage medium, the encoded design structure including instructions that when processed by an electronic design automation tool generates a machine executable representation of a pixel sensor cell circuit, the instructions comprising:
    a first instruction processed to generate a photodiode coupled in series with a first source/drain region of a transfer gate transistor;
    a second instruction processed to generate a floating diffusion coupled in series with a second source/drain region of the transfer gate transistor;
    a second instruction processed to generate a column circuit output coupled to the floating diffusion through a gate of a source follower transistor connected to the floating diffusion, the source follower transistor coupled in series with a and row select transistor whose source/drain region provides the column circuit output; and
    a fourth instruction processed to generate a column circuit connected to the column circuit output, the column circuit including a first set of two pass gate transistors and a second set of two pass gate transistors, each pass gate transistor of said first set and second set having a first source/drain region connected in parallel to the column circuit output, each of said two pass gate transistors of each respective said first and second set further having a second source/drain region connected in series to a separate data storage capacitor,
    wherein said first set of two pass gate transistors is configured to operate in a correlated double sampling mode to obtain a respective first reference charge and a first signal charge from the floating diffusion with the transfer gate transistor off; and
    said second set of two pass gate transistors is configured to operate in an uncorrelated double sampling mode to obtain a respective second reference charge and a second signal charge different from the first signal charge from the floating diffusion with the transfer gate transistor on.

6. The design structure of claim 5 wherein the design structure comprises a netlist.

7. The design structure of claim 5 wherein the design structure resides on storage medium as a data format used for the exchange of layout data of integrated circuits.

8. The design structure of claim 5 wherein the pixel sensor cell circuit includes at least four transistors not included within the column circuit.

9. The design structure of claim 5 wherein the pixel sensor cell circuit includes at least six transistors not included within the column circuit.

10. The design structure of claim 5 wherein the pixel sensor cell circuit includes a shared pixel architecture.

11. A method for operating a pixel sensor cell circuit comprising:
    providing a pixel sensor cell comprising:
        a photodiode coupled in series with a first source/drain region of a transfer gate transistor;
        a floating diffusion coupled in series with a second source/drain region of the transfer gate transistor;
        a column circuit output coupled to the floating diffusion through a gate of a source follower transistor connected to the floating diffusion, the source follower transistor coupled in series with a and row select transistor whose source/drain region provides the column circuit output; and
        a column circuit connected to the column circuit output, the column circuit including at least two pass gate transistors having a first source/drain region connected in parallel to the column circuit output, each pass gate transistor further having a second source/drain region connected in series to a separate data storage capacitor; and
    reading to the separate data storage capacitors at least:
        a first reference charge and a first signal charge from the floating diffusion with the transfer gate transistor off; and
        a second reference charge and a second signal charge different from the first signal charge from the floating diffusion with the transfer gate transistor on.

12. The method of claim 11 further comprising:
differentially reading the first reference charge and the first signal charge to provide a first differential voltage associated with a first dynamic range of the pixel sensor cell; and
differentially reading the second reference charge and the second signal charge to provide a second differential voltage associated with a second dynamic range of the pixel sensor cell different than the first dynamic range of the pixel sensor cell.

13. The method of claim 11 wherein the column circuit includes two separate data storage capacitors.

14. The method of claim 11 wherein the column circuit includes at least three separate data storage capacitors.

15. The method of claim 11 wherein the pixel sensor cell circuit includes four transistors not included within the column circuit.

16. The method of claim 11 wherein the pixel sensor cell circuit includes at least four transistors not included within the column circuit.

17. The method of claim 11 wherein the pixel sensor cell circuit includes at least six transistors not included within the column circuit.

18. The method of claim 11 wherein the pixel sensor cell circuit includes a shared pixel architecture.

* * * * *